United States Patent [19]

Morriss

[11] 4,278,938
[45] Jul. 14, 1981

[54] ELECTROMAGNETIC ARRANGEMENT FOR MEASURING ELECTRICAL CURRENT

[75] Inventor: Jeffrey C. Morriss, Lisle, Ill.

[73] Assignee: Bell Telephone Laboratories, Incorporated, Murray Hill, N.J.

[21] Appl. No.: 61,261

[22] Filed: Jul. 27, 1979

[51] Int. Cl.³ .................... G01R 19/00; G01R 33/00; H04M 3/22
[52] U.S. Cl. .......................... 324/117 R; 179/18 FA; 324/127; 324/244
[58] Field of Search ................. 324/117 R, 127, 244, 324/257, 260; 330/8; 179/18 FA

[56] References Cited

U.S. PATENT DOCUMENTS

| | | | |
|---|---|---|---|
| 2,108,642 | 2/1938 | Boardman | 330/8 |
| 3,699,442 | 10/1972 | Riley | 324/117 R |
| 3,855,528 | 12/1974 | Brown | 324/117 R |

*Primary Examiner*—Ernest F. Karlsen
*Attorney, Agent, or Firm*—Sherman N. Turner

[57] ABSTRACT

A line current measuring arrangement employs a single toroidal core with line windings, control windings, and a sense winding. The line windings cause an amount and polarity of magnetizing intensity H in the core when a line current flows. The control windings are pulsed by control current pulses to cause successively equal changes of opposite polarity of control H in the core to drive the core to successively opposite polarities of B saturation. The sense winding is arranged so that successive changes of B cause successive sense voltage pulses of opposite polarity. Successive sense voltage pulses are of different amplitude only if a line current is flowing to cause an amount of line H in the core. Successive voltage pulses are cumulatively and algebraically integrated to provide a changing output voltage which is a measure of the cumulative integration. The output voltage causes feedback H in the core in opposition to any line H. The output voltage becomes constant when the feedback H cancels the line H, whereupon the constant output voltage is a measure of any line current.

11 Claims, 2 Drawing Figures

ELECTROMAGNETIC ARRANGEMENT FOR MEASURING ELECTRICAL CURRENT

CROSS-REFERENCE TO RELATED APPLICATIONS

The present invention is an improvement on the invention disclosed and claimed in a U.S. application Ser. No. 061,464 of J. H. Condon for "Electromagnetic Arrangement for Measuring Electrical Current" filed on the same day as the present application.

Another improvement on the Condon invention is disclosed and claimed in a U.S. application Ser. No. 061,463 of J. L. Henry for "Electromagnetic Arrangement for Measuring Electrical Current" filed on the same day as the present application.

TECHNICAL FIELD

The technical field of the present invention is generally the art of measuring electrical current and particularly the art of using electromagnetic technique to do so.

BACKGROUND OF THE INVENTION

The Condon arrangement provides two separate essentially matching toroidal magnetic cores with line circuit windings, control circuit windings, sense windings, and feedback windings. Line current flowing in the line windings causes in the two cores essentially equal amounts of the same polarity of line current magnetizing intensity H. A pulse of control current flowing in the control windings causes corresponding changes in the two cores of control current magnetizing intensity H where the changes of control H in the two cores are of essentially equal amounts of control H but of the opposite polarity. Each change of control H causes the magnetic inductions B in the two cores to undergo corresponding changes from an amount of one polarity of B corresponding to a zero amount of control H to B saturation of the same polarity of B and then from B saturation back to an amount of the same polarity of B corresponding to a zero amount of control H. These changes of B in the two cores occur along minor saturation hysteresis loops. The changes of B in the two cores produce induced voltages in the sense windings which are connected in series opposition with regard to polarity of the induced voltages. With no line H present in the two cores, the output of the series connection of sense windings is essentially zero voltage since the changes of B in the two cores are essentially of equal amounts of opposite polarity. The presence in the two cores of line H, due to the flow of line current, causes the changes of B in the two cores to differ by an amount which is a measure of the amount and polarity of line H (and thus a measure of the amplitude and polarity of line current). Such a difference in the changes of B in the two cores produces a voltage pulse, the amplitude and polarity and duration of which are a measure of the difference between the amounts of polarities of the changes of B in the two cores. A succession of voltages pulses is cumulatively and algebraically integrated to provide a changing output voltage, and amplitude and polarity of which are a measure of the cumulative integration. The output voltage is used to cause in each core, by means of either the sense windings or the feedback windings, an amount of feedback H where the amount is according to the output voltage and the polarity opposes any line H in the two cores. The output voltage becomes essentially constant when the feedback H essentially cancels the line H in the two cores and the amplitude and polarity of the constant output voltage are a measure of the amplitude and polarity of line current.

While the Condon arrangement is quite satisfactory from an operational standpoint, it requires two cores which are essentially matched. It is an advantage to circuit designers and to magnetic structure designers not to be required to contend with the necessity for such matching.

SUMMARY OF THE INVENTION

The present invention realizes all of the advantages of the Condon arrangement but does so by using a single magnetic path, by causing successively opposite polarity changes of H and B in the single path, by producing successive opposite polarity voltage pulses according to the successive opposite polarity changes of B, and by integrating a plurality of successive voltage pulses to provide an output voltage for feedback and for representing the amplitude and polarity of line current.

In particular, the present invention uses a control circuit linked to the magnetic path so that successive control current pulses drive the path to successively opposite polarities of B and then allow successive collapses of B to opposite polarities of B corresponding to zero amounts of control H.

Specifically, the present invention causes the single path to undergo changes of B along the major saturation hysteresis loop and causes the successive collapses of B to the be used to induce the successive voltage pulses for integration.

BRIEF DESCRIPTION OF THE DRAWING

The drawing consists of one sheet including two figures briefly describes as follows.

Figure 2:
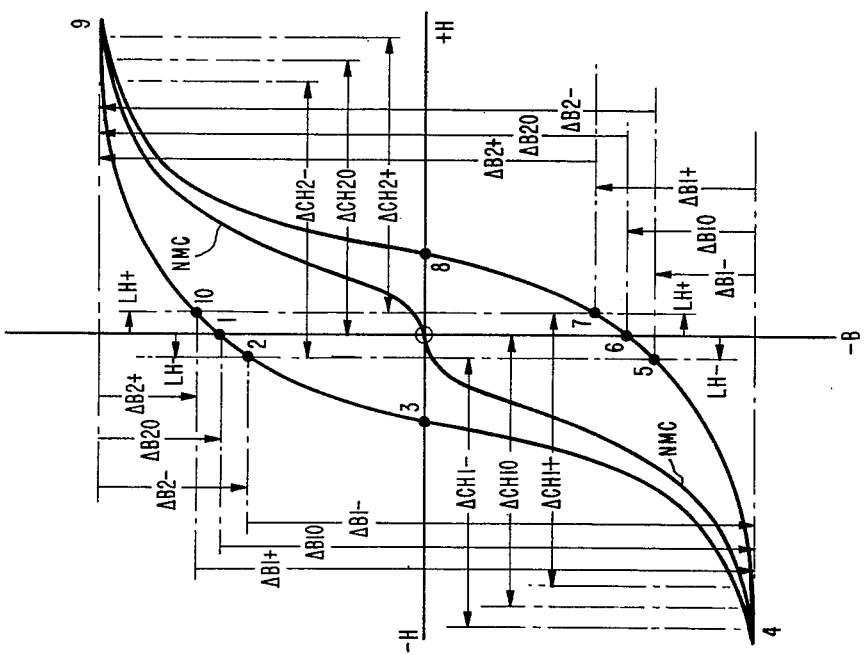

and, FIG. 2 is a representation of a static hysteresis characteristic of the core with notations useful in explaining the dynamic functioning thereof.

DETAILED DESCRIPTION

Figure 1:
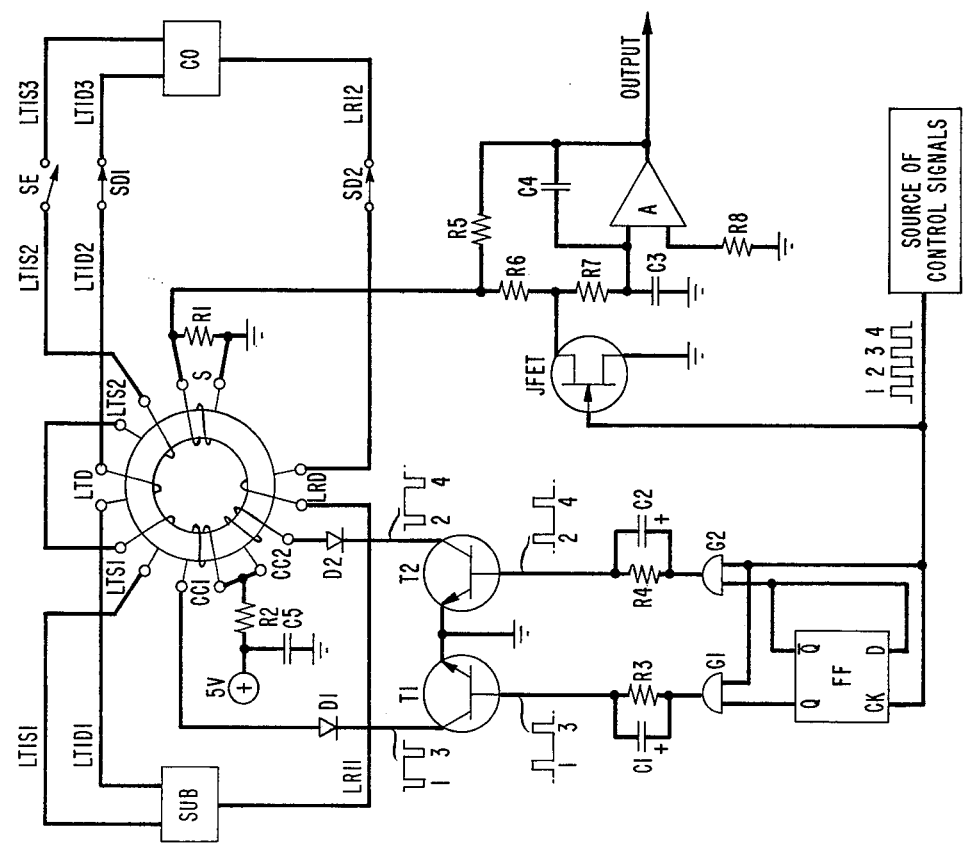
FIG. 1 is a schematic showing of an embodiment of the invention using a single toroidal core.

FIG. 1 shows how a single magnetic core may be connected to circuitry for measuring line current. The box "SUB" represents a telephone subscriber's station equipment. The box "CO" represents a telephone switching center, such as the usual central office. The subscriber's station is connected to the central office by way of a loop comprising the lines LT1D1, LT1D2, LT1D3, LR12 and LR11 by way of closed switches SD1 and SD2. The subscriber's station is also connectable, if so desired, to the central office by way of a single longitudinal circuit comprising the lines LT1S1, LT1S2 and LT1S3 by way of switch SE in the closed position with switches SD1 and 5D2 in the open positions. Line windings LTD and LRD link the core such that a direct current flowing in the entire loop prouces in the core a corresponding amount and polarity (such as clockwise in the core of FIG. 1) of magnetizing intensity H. The winding LTD and LRD are so related as to aid each other in producing line H due to loop current; but, these windings LTD and LRD are so related as to oppose each other in producing line H in the core due to longitudinal current, such as current flowing in the same direction (right to left or left to right in FIG. 1) in the two sides of the loop.

The core in FIG. 1 has magnetic characteristics such that the slope of the hysterisis characteristic changes substantially as the magnetizing intensity H changes between a zero amount of H and a finite amount of H. Such a core may be of ferromagnetic material, such as ferrite. The core is preferably a solid continuous core of toroidal shape.

There are two control windings CC1 and CC2 linking the core and connected to circuitry, as will be explained, whereby successive control current pulses may be caused to flow in alternate ones of the control windings.

The core has linked thereto a sense winding S connected to circuitry, as will be explained, whereby changes in magnetic induction B in the core may be detected electromagnetically. The sense winding S is also controlled, as will be explained, to provide in the core a feedback H. With switches SD1 and SD2 closed as shown and switch SE open as shown, the sense winding S will sense changes of B which are measures of the amount, if any, of line H causes by loop current. If switches SD1 and SD2 are opened and switch SE is closed, the sense winding S will sense changes of B which are measures of the amount, if any, of longitudinal current in the line LT1S1, LT1S2, LT1S3.

It is to be noted that control windings CC1 and CC2 are arranged on the core so that a control current pulse of particular amplitude and polarity flowing in either control winding will produce essentially equal amounts of control H but of opposite polarity (that is, one clockwise and the other counterclockwise in the core in FIG. 1). Thus, the control H in the core will aid the line H when one control winding is pulsed and will oppose the line H when the other control winding is pulsed.

It is also to be noted that the sense winding S is arranged to produce a voltage pulse at the top of resistance R1 where the amplitude and duration and polarity of the voltage pulse is a measure of the combined amounts and polarities of line H and control H. If no line H is present, the equal but opposite changes of control H will cause equal but opposite changes of B which, in turn, will cause voltage pulses of equal but opposite polarity at the top of resistance R1. If, on the other hand, some amount of line H is present due to some amplitude and polarity of line current, then the successive changes of B will not be equal but will be unequal by an amount which is a measure of the amount of line H. In the latter instance, there will be produced at the top of resistance R1 successive voltage pulses of opposite polarity but of unequal amplitudes; and, the differences between successive pairs of such voltage pulses are cumulatively and algebracially integrated by the amplifier A and capacitor C4 circuit, as will be explained.

In FIG. 1, the source of control signals provides a normally LOW (L) logic level at the clock input CK of the D-type flip-flop FF, at the right inputs to gates G1 and G2 and at the control input to the junction field effect transistor JFET. The L level is interrupted at a 20KH$_3$ rate by a HIGH (H) level of about 10 volts. HIGH (H) and LOW (L) will be understood to mean respective logic levels of about +5 volts direct current potential and ground potential. Each H lasts for about 30 microseconds ($\mu$s) and each L lasts for the remaining 20 $\mu$s. Thus, FF receives at its input CK a succession of LOW-to-HIGH-to-LOW (L to H to L) pulses of about 10 volts for about 30 $\mu$s every 50 $\mu$s.

As is well known, the D-type FF will respond to each L to H at its input CK to adjust its Q output of the logic level at its D input, which is the same as the $\overline{Q}$ output. Thus, for example, the Q output will be H and the $\overline{Q}$ (along with D input) output will be L for one entire 50 $\mu$s period of the control signals; and, the Q output will be L with the $\overline{Q}$ output H during the next succeeding entire 50 $\mu$s period of the control signals.

In FIG. 1, each of the AND gates G1 and G2 will provide a L output unless both of its inputs are H when it will provide a H output.

Also, when either gate G1 or G2 has a H output, its corresponding transistor T1 or T2 will be fully conducting; whereas, when either gate G1 or G2 has an L output, its corresponding transistor T1 or T2 will be turned off (that is, not conducting). It is thus seen, for example, that gate G1 provides a H output during the 30 $\mu$s H of each odd (that is, numbers 1, 3, 5, 7, et cetera) control signal and a L output at other times; whereas, gate C2 provides a H output during the 30 $\mu$s H of each even (that is, numbers 0, 1, 2,4 et cetera) control signal and a L output at other times.

The result of the foregoing is that transistor T1 is fully conducting during each odd 30 $\mu$s H control signal and is turned off at other times; whereas, transistor T2 is fully conducting during each even 30 $\mu$s H control signal and is turned off at other times. When one of transistors T1 and T2 turns on during the corresponding H control signal, the corresponding control winding CC1 or CC2 is caused to have a corresponding pulse of current flow therein. The polarities of the control current pulses in windings CC1 and CC2 are the same; but, the windings CC1 and CC2 link the core in opposite senses so that the respective control current pulses cause opposite changes of control H in the core. Each control current pulse is of sufficient polarity, duration and amplitude to drive the core to B saturation; and, successive control current pulses drive the core into successive B saturations of opposite polarity.

FIG. 2 represents the hysteresis characteristic for the core material where the curve NMC is recognized as the normal magnetization curve and where the curve 1 through 10 is the major saturation hysteresis curve or lasp. The points 1 and 6 indicate the values of magnetic induction B where the magnetizing intensity H is zero.

If no line current is flowing in FIG. 1 there will be no H in the core except during the 30 $\mu$s control current pulses. Assuming that the core is at point 1 in FIG. 2, a change of control H, such as $\Delta$CH10, drives the core along the first curve for successive points 1 through 4 into negative B saturation and then allows B to collapse along points 4 to 5 to 6. The next change of control H, such as $\Delta$CH20 will first drive the core along points 7, 8 and 9 into positive B saturation and will then allow B to collapse along points 9 to 10 to 1. As a result of these two successive changes of control H, the corresponding changes of B are equal and of opposite polarity: that is, $\Delta$B10 is equal to $\Delta$B20 both on build-up to B saturation and on collapse to an amount of B corresponding to a zero amount of H. In this case, the successive voltage pulses produced in FIG. 1 at the top of resistance R1, both for the build-up changes of B and for the collapse changes of B, are equal and of opposite polarity.

If a line loop current is flowing in FIG. 1, a corresponding amount of line H is induced into the core. Assuming in FIG. 2 that the core is at point 10 due to a positive amount LH+ of line H, a change of control H, such as ΔCH1+ will drive the core along points 10, 1, 2, 3 and 4 into negative B saturation from which the B will collapse along 4, 5 and 6 to point 7. The latter will have provided two changes of B, ΔB1+ from point 10 down to point 4 and ΔB1+ from point 4 up to point 7. The next successive change of control H, such as ΔCH2+, will drive the core from point 7 through 8 to positive B saturation at point 9 from which the B will collapse from point 9 to point 10. The latter will have provided two changes of B, ΔB2+ from point 7 up to point 9 and ΔB2+ from point 9 down to point 10. There will now be a difference between the amounts of the corresponding changes of B and that difference is a measure of the amount and polarity of line current.

In FIG. 2, if the line current were reversed from the foregoing assumed situation, it will be apparent that the B in the core will be driven from one starting point of 2 down to saturation at point 4 and then will be allowed to collapse to point 5; and, the B in the core will next be driven from the other starting point of 5 up to saturation at point 9 from where B will be allowed to collapse to point 2. That situation will produce two pairs of corresponding changes of B, the pair of ΔB1- and ΔB2- on build-up to saturation and the pair of ΔB1- and ΔB2- on collapse; and, the differences between the changes of B in each pair are measures of the amount and polarity of line current, it being noted that the polarity of the differences has reversed from the previously considered example of a line current of the other polarity.

In FIG. 1, it will be recalled that the control signals appear at the control input of the JFET. The JFET will be turned on during the 30 μs H control signal used to cause each control current pulse and is turned off at the end of the 30 μs control signal. Since the JFET is on during the 30 μs H control signal, the JFET represents essentially a short circuit to ground from the bottom of resistance R6 for the duration of that 30 μs interval. This, in effect, prevents amplifier A from responding to any voltage pulse through R6 caused by build-up of B in the core. However, at the end of the 30 μs H control signal the control current pulse will drop to zero to allow B to collapse; and, during that collapse the JFET will have been turned OFF. Thus, any voltage pulse produced by sense winding S at the top of resistance R1 and through resistance R6 will not be shunted to ground through the JFET but will be allowed to control the upper input to amplifier A. It will be recalled that the two successive changes of B on collapse will differ in amount and polarity according to the amount of line H. Consequently, successive voltage pulses will be provided to amplifier A where each pair of corresponding voltage pulses will be of different amplitude and of opposite polarity and where the difference in amplitudes is a measure of the amount, if any, of line H in the core.

The arrangement in FIG. 1 of the amplifier A and capacitor C4 is a negative feedback configuration whereunder the amplifier A is prepared to sense a difference of potential across its input terminals (left) so as to produce at its output terminal (right) an opposite polarity voltage after rather high amplification, such as a mu (μ) in the order of $10^5$. The arrangement is such as to acquire a charge on capacitor C4 representing at the output of amplifier A a voltage which is a measure of the algebraic integration of whatever difference of voltage appears at the input terminals of amplifier A. As will be seen, the output of amplifier A will be a voltage, the amplitude and polarity of which are a measure from time to time of the cumulative algebraic integration of whatever voltage differences appear at its input terminals.

Over a plurality of successive control signals the amplifier A and capacitor C4 arrangement of FIG. 1 will accumulate at the output of amplifier A a changing output voltage the amplitude and polarity of which are a measure of the cumulative integration of the differences between a plurality of pairs of successive voltage pulses from sense winding S. As that output voltage gradually builds up in amplitude the changing output voltage is used through resistance R5 and the sense winding S to provide feedback H to the core where the amount of the feedback H is according to the output voltage and where the polarity of the feedback H is such as to oppose the polarity of whatever line H exists in the core. Each additional increment of output voltage (caused by each pair of successive changes of B in the core) causes an additional increment of feedback H, which in turn cancels out part of the line H so that succeeding voltage pulses from sense winding S become of less and less amplitude. Eventually the output voltage becomes essentially constant when the feedback H has essentially cancelled the line H, whereupon the amplitude and polarity of the output voltage are a measure of the amplitude and polarity of line current.

Typical parameters in FIG. 1 are as follows: windings LTD, LRD LTS1 and LTS2 are single-turn windings; windings S, CC1 and CC2 are 30-turn windings; resistance R1 is 287 ohms; resistance R2 is 143 ohms; resistances R3 and R4 are 909 ohms each; resistance R5 is 300 ohms; resistance R6 is 10,000 ohms; resistance R7 is 12,000 ohms; resistance R8 is 61,000 ohms; capacitors C1 and C2 are 1.0 microfarads (μf); capacitor C3 is 0.1 μf; capacitor C4 is 4700 picofarads (pf); and, capacitor C5 is 33 μf.

It is to be understood that the above-described arrangement is illustrative of the application of the principles of the invention. Other arrangements may be devised by those skilled in the art without departing from the spirit and scope of the invention. For example, while a direct current line current has been assumed as an example, it will be obvious that the invention may be used to measure alternating line currents provided the frequency of the control signals is high enough relative to the frequency of line current so that enough samples of the line current envelope are secured so that the integrated output of amplifier A is a fair representation of the changing amplitude and polarity of the line current. Also, while a solid toroidal core of ferrite has been used in the preferred embodiment, it will be apparent that any reentrant magnetic path of low reluctance may be used. In addition, while the preferred embodiment uses the major saturation hysteresis loop, it is quite apparent that another major hysteresis loop could be used so long as detectable differences are realized between successive changes of B. Also, while in the preferred embodiment the collapses of B have been used as the mechanism for deriving the voltage pulses, it will be apparent that the build-ups of B could be similarly used along with a suitable change in the JFET control to accommodate such a variation. It will also be quite apparent that line current other than that in a telephone system may be measured by the use of the invention.

I claim:

1. An arrangement for measuring an electrical line current flowing in a line circuit comprising:

(A) a single magnetic path having magnetic characteristics such that the slope of the hysteresis characteristic changes substantially as the magnetizing intensity H changes between a zero amount of H and a finite amount of H;

(B) means electromagnetically coupling the line circuit to the path so that a particular amplitude and polarity of line current causes in the path a corresponding finite amount and polarity of line H;

(C) means for supplying a succession of control signals;

(D) a control circuit controlled by each control signal so that a corresponding pulse of particular amplitude and duration and polarity of electrical control current flows in the control circuit;

(E) means electromagnetically coupling the control circuit to the path so that successive control current pulses cause in the path successive corresponding changes of control H where the successive changes of control H are of essentially equal finite amounts of the opposite polarity;

(F) the successive changes of control H being such as to cause the magnetic induction B in the path to undergo successive corresponding changes of opposite polarity where the amounts of the changes of B are determined by the combined amount and polarity of line H and control H;

(G) means controlled by each control signal and by the corresponding change of B to produce a corresponding voltage pulse the amplitude and duration and polarity of which are a measure of the amount and polarity of line H in the path;

(H) means controlled by a plurality of successive voltage pulses
  (1) to perform cumulative algebraic integration of the successive voltage pulses
  (2) and to provide a changing output voltage the amplitude and polarity of which are a measure of the cumulative integration;

(I) and, means controlled by the output voltage to cause in the path an amount of feedback H where
  (1) the amount of feedback H is according to the amplitude of the output voltage
  (2) and the polarity of the feedback H is opposite to the polarity of any line H;

(J) whereby
  (1) the amplitude of the output voltage becomes essentially constant when in the path the amount of feedback H essentially equals the amount of line H
  (2) and the amplitude and polarity of the constant output voltage are a measure of the amplitude and polarity of the line current.

2. The invention defined in claim 1 wherein:
(A) each change of B in the path comprises
  (1) a first type of change occurring at the start of the corresponding control current pulse when B changes from an amount of one polarity of B corresponding to a zero amount of control H to an amount of the opposite polarity of B;
  (2) and a second type of change occurring at the end of the corresponding control current pulse when B changes from the said amount of the opposite polarity of B to an amount of the said opposite polarity of B corresponding to a zero amount of control H;
(B) and, the voltage pulse producing means is controlled by the same type of change of B.

3. The invention defined in claim 2 wherein the voltage pulse producing means is controlled by only the second type of change of B.

4. The invention defined in claim 3 wherein the changes of B are along a major hysteresis loop.

5. The invention defined in claim 4 wherein the major hysteresis loop is the major saturation hysteresis loop.

6. The invention defined in claim 1 or 2 or 3 or 4 or 5 wherein:
(A) the line circuit coupling means comprises line winding means linking the path;
(B) the control circuit coupling means comprises control winding means linking the path in addition to the line winding means;
(C) the voltage producing means and the feedback H causing means comprise winding means linking the path in addition to the line winding means and the control winding means;
(D) and, the control circuit comprises means controlled by successive control signals to enable the control winding means to cause the corresponding successive opposite polarity changes of control H.

7. The invention defined in claim 6 wherein the enabling means is controlled by successive control signals to cause corresponding successive control current pulses to flow in the control winding means in such corresponding successive manners as to cause the corresponding successive opposite polarity changes of control H.

8. The invention defined in claim 7 wherein:
(A) the control winding means comprises two control windings linking the path in opposite polarity senses;
(B) and, the enabling means causes alternate successive control current pulses to flow in alternate ones of the two control windings.

9. The invention defined in claim 8 wherein the path is a reentrant low-reluctance magnetic path.

10. The invention defined in claim 9 wherein the path is a continuous solid magnetic core.

11. The invention defined in claim 10 wherein the core is of toroidal shape.

* * * * *